(12) United States Patent
Helneder

(10) Patent No.: US 7,638,434 B2
(45) Date of Patent: Dec. 29, 2009

(54) METHOD FOR FILLING A TRENCH IN A SEMICONDUCTOR PRODUCT

(75) Inventor: Johann Helneder, Pliening/Landsham (DE)

(73) Assignee: Infineon Technologies AG, Neubiberg (DE)

( * ) Notice: Subject to any disclaimer, the term of this patent is extended or adjusted under 35 U.S.C. 154(b) by 140 days.

(21) Appl. No.: 11/847,797

(22) Filed: Aug. 30, 2007

(65) Prior Publication Data
US 2008/0057708 A1 Mar. 6, 2008

(30) Foreign Application Priority Data
Aug. 30, 2006 (DE) .................. 10 2006 040 585

(51) Int. Cl.
*H01L 21/44* (2006.01)
(52) U.S. Cl. .................. 438/687; 438/626; 438/631; 438/633
(58) Field of Classification Search .................. 438/625, 438/626, 627, 631, 633, 634, 643, 645, 653, 438/687
See application file for complete search history.

(56) References Cited

U.S. PATENT DOCUMENTS

| 6,709,979 | B2 * | 3/2004 | Komai et al. ................. 438/678 |
| 6,743,268 | B2 | 6/2004 | Cote et al. |
| 6,899,597 | B2 | 5/2005 | Wrschka et al. |
| 6,953,742 | B2 * | 10/2005 | Chen et al. .................. 438/622 |
| 7,390,429 | B2 * | 6/2008 | Liu et al. .................... 252/79.1 |
| 2003/0113996 | A1 * | 6/2003 | Nogami et al. .............. 438/638 |
| 2005/0077627 | A1 * | 4/2005 | Yu et al. ...................... 257/751 |
| 2005/0153546 | A1 * | 7/2005 | Ahrens et al. ............... 438/677 |
| 2006/0008968 | A1 | 1/2006 | Brask et al. |
| 2006/0113675 | A1 | 6/2006 | Chang et al. |
| 2006/0134915 | A1 | 6/2006 | Hoang et al. |
| 2006/0205204 | A1 * | 9/2006 | Beck .......................... 438/628 |

FOREIGN PATENT DOCUMENTS

DE 10 2004 002 407 A1 11/2004
KR 1020040043383 A 5/2004

* cited by examiner

*Primary Examiner*—Kevin M Picardat
(74) *Attorney, Agent, or Firm*—Slater & Matsil, L.L.P.

(57) ABSTRACT

Method for filling a trench in a semiconductor product is disclosed. A first material is deposited onto a semiconductor product having a surface in which at least one trench is formed. A first layer is formed within the trench and on the surface of the semiconductor product outside the trench. A second material is deposited to form a second layer above the first layer outside the trench and the trench is filled. Chemical mechanical polishing is performed so that the second layer is removed above the first layer outside the trench and whereby the first layer is at least uncovered outside the trench. Residual first material of the first layer is removed by wet-chemical etching.

24 Claims, 13 Drawing Sheets

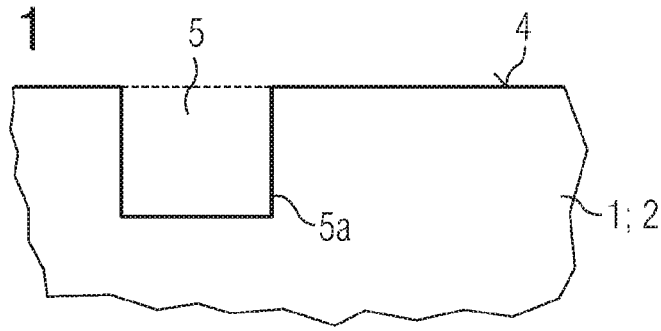
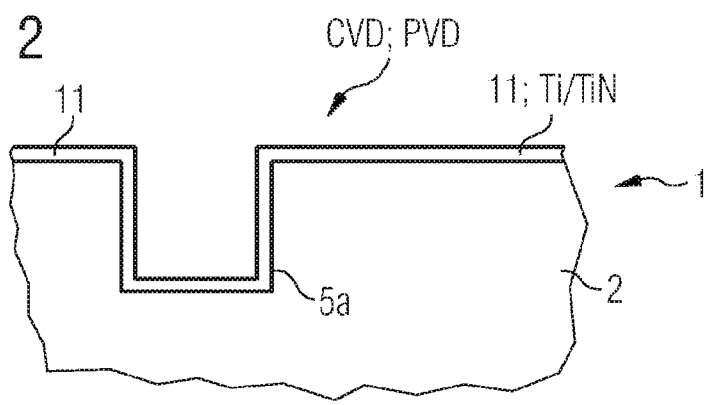
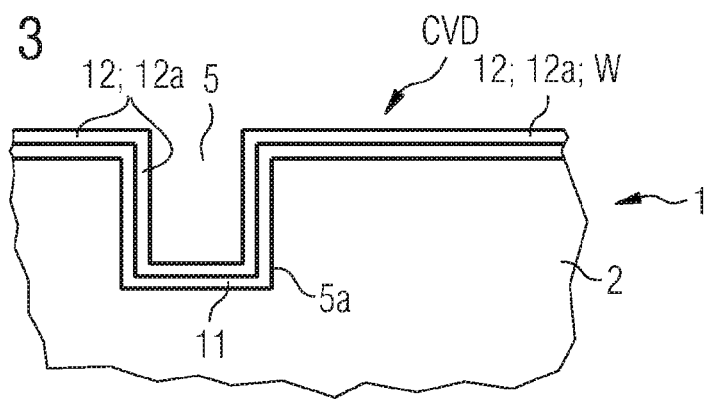
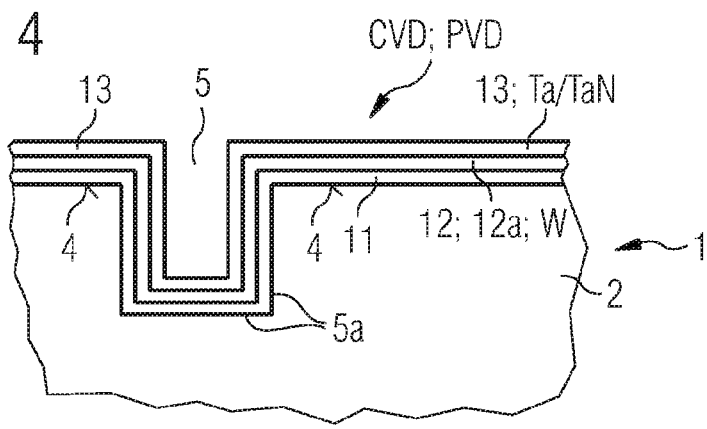

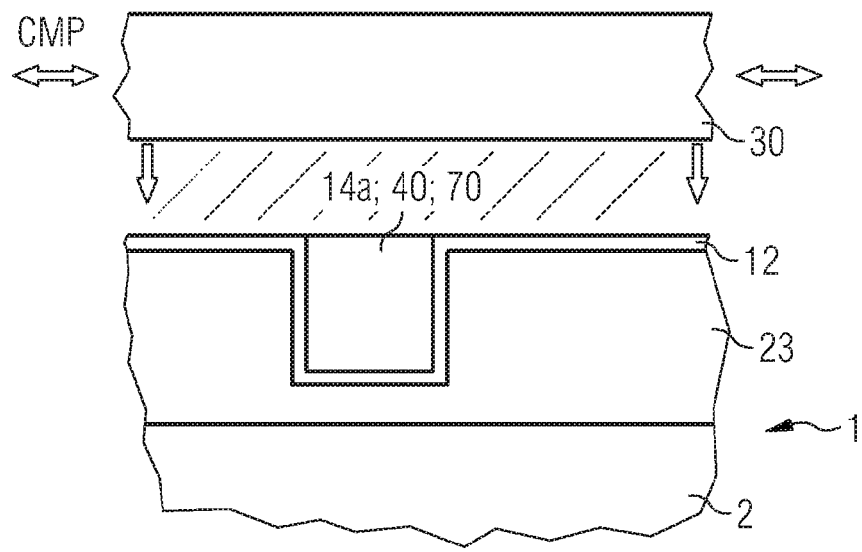
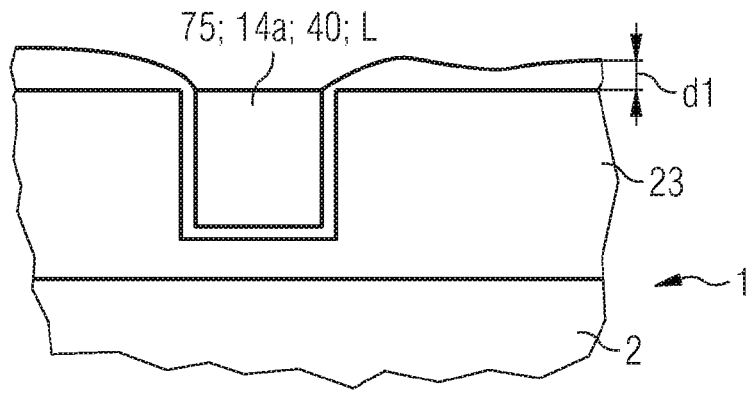
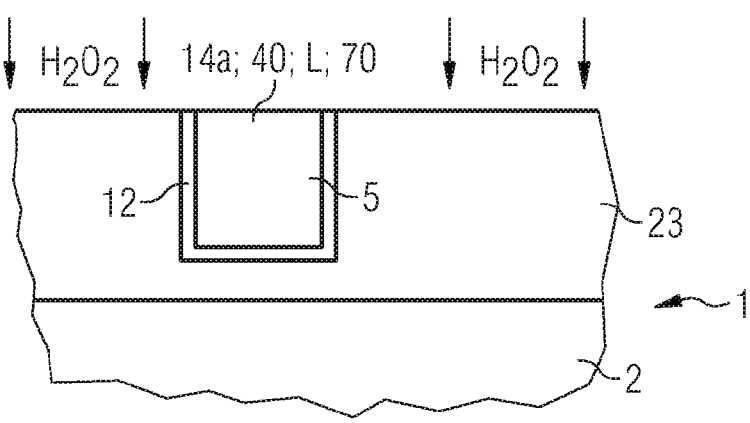

METHOD FOR FILLING A TRENCH IN A SEMICONDUCTOR PRODUCT

This application claims priority to German Patent Application 10 2006 040 585.4, which was filed Aug. 30, 2006, and is incorporated herein by reference.

TECHNICAL FIELD

The invention relates to the field of semiconductor fabrication and in one embodiment, to a method for filling a trench in a semiconductor product.

BACKGROUND

In semiconductor fabrication, a plurality of individual structures are produced on a substrate (generally a semiconductor substrate). Etching methods, polishing methods, deposition methods and the like are used for this purpose. For many structure elements such as, for example, electrical terminal contacts, vertically contact-connecting contact hole fillings (vias), interconnects, etc., it is necessary firstly to etch trenches. Such trenches can be arranged in the semiconductor substrate, in a layer, for example, a dielectric layer, arranged on or above the semiconductor substrate, or in some other region of a semiconductor product. When the trenches are subsequently filled, usually a filling material is deposited over the whole area onto the partly finished semiconductor product and then removed superficially as far as the level of the upper edge of the trench. A partial etching back, a chemical mechanical polishing operation or some other etching method can be used for this purpose.

In semiconductor fabrication, it is always desirable for the semiconductor product to have a surface that is as planar as possible, i.e., a surface whose topmost structures produce the least possible topographies or height differences. This is necessary particularly owing to the limited depth of focus in the lithographic patterning of masks for further processing steps. A relatively planar surface is achieved by chemical mechanical polishing, for example, which involves moving a polishing pad in a lateral direction parallel to the substrate surface or to the surface of the semiconductor product, wherein a polishing slurry containing an etching component and also polishing grains that cause mechanical abrasion covers the polished surface and the polishing pad.

However, the plane surface ideally sought by means of the chemical mechanical polishing is generally achieved only approximately; different high removal rates of structure elements composed of different materials on different positions of a wafer (or within the circuit of a single chip) lead to height fluctuations of the top side which have an effect locally and globally over the entire wafer surface. These thickness fluctuations arise on account of the polishing process itself. The fluctuations turn out to be greater, the thicker a layer was that was removed beforehand by chemical mechanical polishing, the lower the selectivity is during the etching of a layer with respect to an underlying layer, and the longer the polishing operation lasts. A long polishing time is attained, in particular, when materials that are difficult to polish are to be removed. Thus, by way of example, time durations of a polishing operation carried out of 1000 seconds or more can lead to topographies that make it more difficult to further process the only partly finished semiconductor product.

If a trench is filled with a filling material, then the latter simultaneously covers the surface of the semiconductor product laterally outside the trench (and also above the trench itself) and must subsequently be removed again from the semiconductor product over the whole area at least at the level above the top side of the trench. It is typically etched back as far as a previously deposited etching stop layer that is more difficult to polish than the filling material. The etching stop layer can also comprise a layer sequence, particularly if further requirements are to be taken into account in the production of an integrated circuit. The layer sequence can comprise, for example, diffusion barrier layers, layers having a high electrical conductivity, adhesion-enhancing layers or other layers. If such layers were deposited below the actual filling material into the trench and the surface of the semiconductor product, these layers must subsequently be removed again from the surface of the semiconductor product outside the trench. Further polishing operations with in part further polishing slurries can be used for this purpose.

The polishing of the trench-filling material above the trench can already give rise to the above-mentioned unevennesses over the wafer area or the area of the semiconductor product. During the subsequent removal of the layers that were deposited below the trench filling and still cover the surface outside the trench, the unevennesses can also be intensified. By way of example, tungsten-containing layers or layer sequences can lead to additional considerable topographies, for instance if they are removed with the aid of a low polishing rate during a relatively lengthy polishing step. However, with other materials, too, there is the problem that with the aid of chemical mechanical polishing operations that are usually carried out after the filling of trenches or other depressions in order to remove excess material, the polished surface subsequently has a poorer planarity, i.e., greater unevennesses.

SUMMARY OF THE INVENTION

A method for filling a trench in a semiconductor product is provided, comprising, depositing a first material onto a semiconductor product having a surface in which at least one trench is formed, whereby a first layer is formed within the trench and on the surface of the semiconductor product outside the trench. A second material is deposited, whereby a second layer is formed above the first layer outside the trench and the trench is filled. Chemical mechanical polishing is performed, whereby the second layer is removed above the first layer outside the trench and whereby the first layer is at least uncovered outside the trench, and residual first material of the first layer is removed by wet-chemical etching.

Furthermore, a method for filling a trench in a semiconductor product is provided, comprising, providing a semiconductor product having at least one substrate, wherein the semiconductor product has a surface in which at least one trench is arranged. A first interlayer is deposited onto the surface of the semiconductor product and into the trench. A first layer composed of a metallic first material is deposited onto the first interlayer by means of a chemical vapor deposition. A second interlayer is deposited onto the first layer. A metallic second material, which predominantly contains copper, is deposited onto the second interlayer by means of an electrolytic deposition until the second material forms a second layer on the second interlayer outside the trench and the trench is completely filled with the second material. Chemical mechanical polishing is performed, whereby the first layer is uncovered outside the trench and the residual material of the first layer is retained on the first interlayer, and the residual material of the first layer is completely removed from the first interlayer by means of wet-chemical etching using hydrogen peroxide.

Furthermore, a method for producing a conductive trench filling on a semiconductor product having at least one trench is provided, comprising, providing a semiconductor product, which has a substrate and a dielectric layer above the substrate and which furthermore has at least one trench which, proceeding from a top side of the semiconductor product, reaches at least into the dielectric layer. At least one first layer composed of a first material is deposited, wherein the first layer extends over a surface of the semiconductor product and into the at least one trench. At least one second layer composed of an electrically conductive second material is deposited on or over the first layer until the second material covers the first layer over the whole area and fills the at least one trench. Chemical mechanical polishing is performed until, over the surface of the semiconductor product outside the at least one trench, the second material has been removed and the first material has been uncovered, and the uncovered first material outside the at least one trench is removed by means of wet-chemical etching until the surface of the semiconductor product has been uncovered outside the at least one trench.

Furthermore, a method for processing a semiconductor product is provided, comprising, providing a semiconductor product having at least one trench arranged in a surface of the semiconductor product. At least one first layer onto the surface of the semiconductor product is deposited and onto an inner wall of the trench, at least one second layer is deposited, which fills the trench and covers the first layer above the surface of the semiconductor product. The second layer outside the trench is etched back to the level of the first layer, whereby the first layer is at least uncovered outside the trench, and the first layer is selectively wet-chemically etched until the surface of the semiconductor product is uncovered again outside the trench.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 to 12 show one embodiment of a method according to an embodiment of the invention;

FIGS. 15 to 20 show another embodiment of a method according to an embodiment of the invention.

DETAILED DESCRIPTION OF ILLUSTRATIVE EMBODIMENTS

Figure 5:
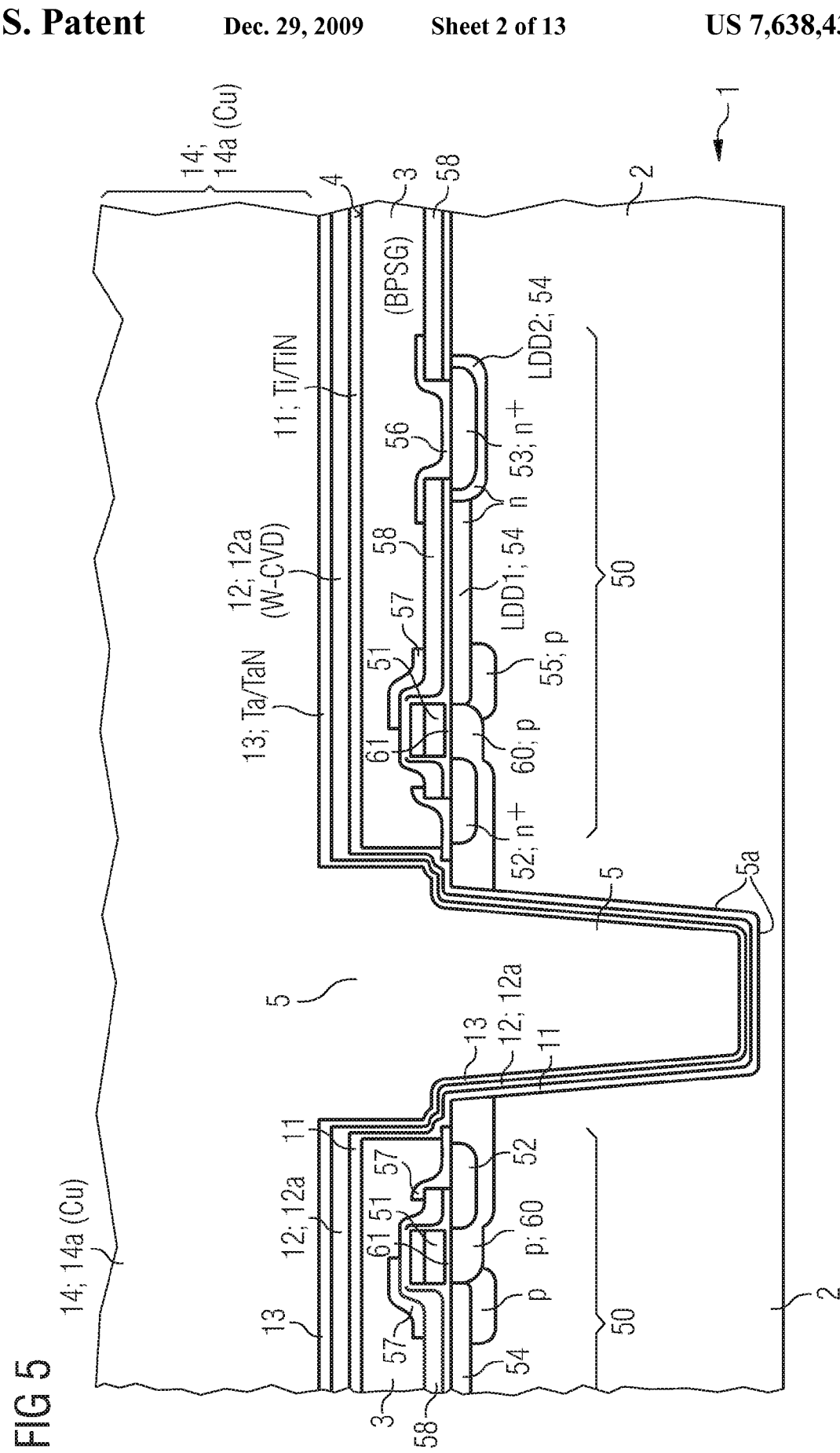

In accordance with FIG. 1, a semiconductor product 1 is provided, which has a substrate 2, preferably a semiconductor substrate composed of silicon, for example. Firstly, at least one trench 5 is etched into the semiconductor product 1, which is, in particular, an only partly finished semiconductor product. The trench 5 is etched into a surface 4 of the semiconductor product 1, whereby a depression is formed in the surface 4. The trench 5 that arises in this way can extend over only one or else over a plurality of layers arranged on the semiconductor substrate. Likewise, the trench 5 can also extend right into the substrate 2. It can also be etched as far as the rear side of the semiconductor product 1 or as far as the rear side of the substrate 2, in which case it passes through the entire thickness of the semiconductor product 1. The trench can either be etched into the surface 4 of a layer arranged on the substrate, or it can be etched directly into an uncovered top side of the semiconductor substrate 2, which top side is simultaneously the surface 4 of the semiconductor product. The type of semiconductor product provided with the trench and the form and the depth of the semiconductor product depend on the respective application and can correspondingly vary.

In accordance with FIG. 2, a first interlayer 11 is deposited onto the surface 4 of the semiconductor product 1 and also into the trench 5; the interlayer can contain titanium, in particular. The first interlayer 11 can be deposited, for example, by a chemical or preferably physical vapor deposition. The first interlayer 11 is not necessarily required; it can also be obviated, in which case the first layer 12 deposited in accordance with FIG. 3 is deposited directly onto the semiconductor product 1 itself. However, the first interlayer 11 can be additionally provided, for example, as an additional adhesion-enhancing layer, as a contact layer or as a barrier layer between the first layer 12 that is still to be deposited and the semiconductor product. The first interlayer 11 can be, for example, a titanium layer, a titanium nitride layer or a layer sequence composed of a titanium layer and a titanium nitride layer arranged thereon (or vice versa).

In accordance with FIG. 3, a first layer 12 composed of a first material 12a is deposited. The deposition of the first layer 12 is preferably effected by a chemical vapor deposition. The material of the first layer 12 (i.e., the first material 12a) preferably substantially comprises tungsten (W). By way of example, a tungsten layer can be deposited as first layer 12.

In accordance with FIG. 4, a second interlayer 13 is optionally deposited. However, just like the first interlayer 11, the second interlayer can also be obviated. In such applications, for example, in which an additional diffusion barrier layer, an adhesion-enhancing layer or a layer that increases the conductivity is desired as second interlayer 13 on the first layer 12, this can additionally be formed as second interlayer 13. This is preferably done, in accordance with FIG. 4, by a chemical or preferably a physical vapour deposition, whereby the second interlayer 13 is formed on the first layer 12 composed of the first material 12a. The second interlayer 13 can also be deposited on the first interlayer 11, i.e., before the deposition of the first layer 12. The second interlayer 13 can contain tantalum. The second interlayer 13 can have, for example, a tantalum layer, a tantalum nitride layer or a layer sequence composed of a tantalum layer and a tantalum nitride layer arranged thereabove (or vice versa). In particular, a layer that prevents or makes more difficult the diffusion of material of a second layer (reference symbol 14 in the subsequent figures) to be deposited thereon can be deposited as second interlayer 13.

FIG. 5 shows an example of a semiconductor product 1 which is covered, in the manner described above, with a first layer 12 and optionally additionally with a first and/or second interlayer 11, 13. The semiconductor product 1 can have a substrate 2, for example, on which a trench 5 is to be etched between two transistors 50. The semiconductor product 1 provided for this purpose has a plurality of transistors 50 on a surface of the semiconductor substrate 2, which transistors can be high-voltage transistors or power transistors, for example. They can be in particular component parts of a "radio frequency power device" to be produced, that is to say power transistors of a semiconductor circuit that operates at radio frequency. The semiconductor circuit can be, for example, an antenna driver device or an antenna output stage for mobile radio, for instance for a base station. Accordingly, the semiconductor product 1 can be a base station (or some other mobile radio device) with an antenna driver device or an antenna output stage. FIG. 5 illustrates by way of example such a transistor 50 to the right of the trench 5; a further transistor 50 is indicated in mirror-inverted fashion with respect thereto to the left of the trench 5, but is not completely represented in FIG. 5. However, its design can correspond to the transistor 50 arranged to the right of the trench. The transistors 50 have a gate electrode 51, a source electrode 52 and a drain electrode 53. The drain electrode 53 is surrounded by two LDD diffusion regions (lightly doped drain), wherein a first LDD diffusion region LDD1 produces a lateral distance, that reduces the electric field strength, between gate electrode 51 and drain electrode 53 and a further LDD diffusion region LDD2 surrounds the drain electrode 53 from all sides in the lateral direction and also from below. The source electrode 52 is arranged on the opposite side of the gate electrode 51; it can likewise be surrounded by a more weakly doped region in the direction of the substrate interior and in the direction of the trench 5 to be filled. Arranged on the surface of the semiconductor substrate 2 is the gate dielectric 61 below the gate electrode 51. Below the gate dielectric 61 runs the channel region 60 of the transistor 50, covered by the gate electrode 51. Finally, in addition pocket dopant regions 55 can also be provided, as well as field plates 57, which likewise serve for shielding individual component parts of the transistor 50 from one another. The field plates 57 can cover, for example, a corner region, facing the drain region 53, of the gate electrode 51 (or an insulation layer 58 arranged thereon). The field plates 57 and also a drain contact layer 56 arranged on the drain electrode 53 can be formed, for example, from a titanium layer, a titanium nitride layer or a layer sequence composed of a titanium layer and a titanium nitride layer.

The transistors 50 illustrated in FIG. 5 and also further microelectronic components of the semiconductor product 1 can be covered, for example, by a dielectric layer 3 having a top side that simultaneously forms the surface 4 of the semiconductor product 1. FIG. 5 illustrates only one possible, arbitrarily chosen example of a semiconductor product 1 into which subsequently a trench 5 is etched (FIG. 1) and a sequence of a plurality of layers is deposited, which cover the surface 4 of the semiconductor product 1 and finally fill the trench. FIG. 5 illustrates the first layer 12 composed of a first material 12a, for example, a tungsten-containing material (in particular tungsten), and also the first and second interlayers 11, 13 that are optionally additionally present. Instead of the materials presented with reference to FIGS. 2 to 4, it is also possible to choose other materials for the two interlayers and the first layer.

Although FIG. 5 illustrates the layer thickness of the layers 11, 12 and 13 as larger outside the trench 5 (i.e., at its trench wall 5a) than within the trench, the layer thicknesses illustrated with an exaggerated size on the surface 4 of the semiconductor product 1 only serve for clarity of illustration; in actual fact the layer thickness at least of the first layer 12 will in practice be just the same in magnitude on the trench wall 5a as on the surface 4 of the semiconductor product 1 outside the trench 5. This can be ensured, for example, by means of a suitable deposition method, for example, a chemical vapor deposition of the first layer 12. The interlayers 11, 13 are preferably deposited by means of a physical vapor deposition.

The first layer 12 preferably comprises a metal, for example, tungsten. An alloy can likewise be used. In this exemplary embodiment, the first layer 12 preferably serves for providing, within the trench 5, the trench wall 5a with a conductive layer that later enables an electrolytic deposition of a material 14a that fills the trench 5.

FIG. 5 illustrates a semiconductor product 1, the surface 4 of which is planar; on account of the dielectric layer 3, which levels topographies on the substrate surface which arise as a result of the transistors 50 and other microelectronic structures, the semiconductor product 1 no longer has an appreciable topography prior to the etching of the trench. The deposition of the relatively thin layers 11, 12 and 13 also does not produce an appreciable topography outside the trench 5.

FIG. 5 furthermore shows that a second layer 14 having a significantly larger layer thickness was deposited onto the semiconductor product covered with the layers 11, 12, 13.

Figure 6:
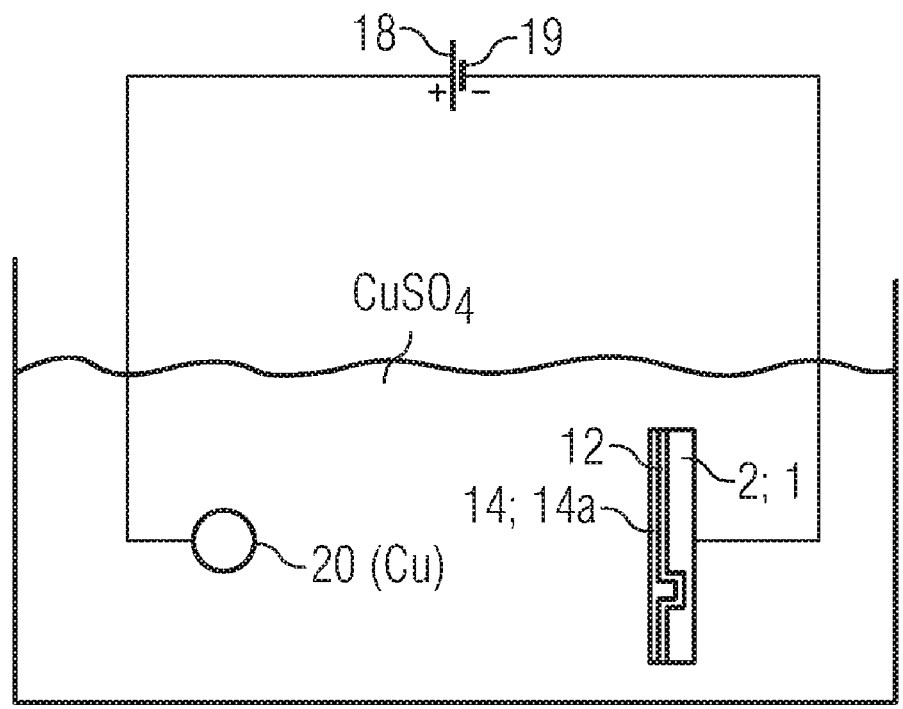
Figure 7:
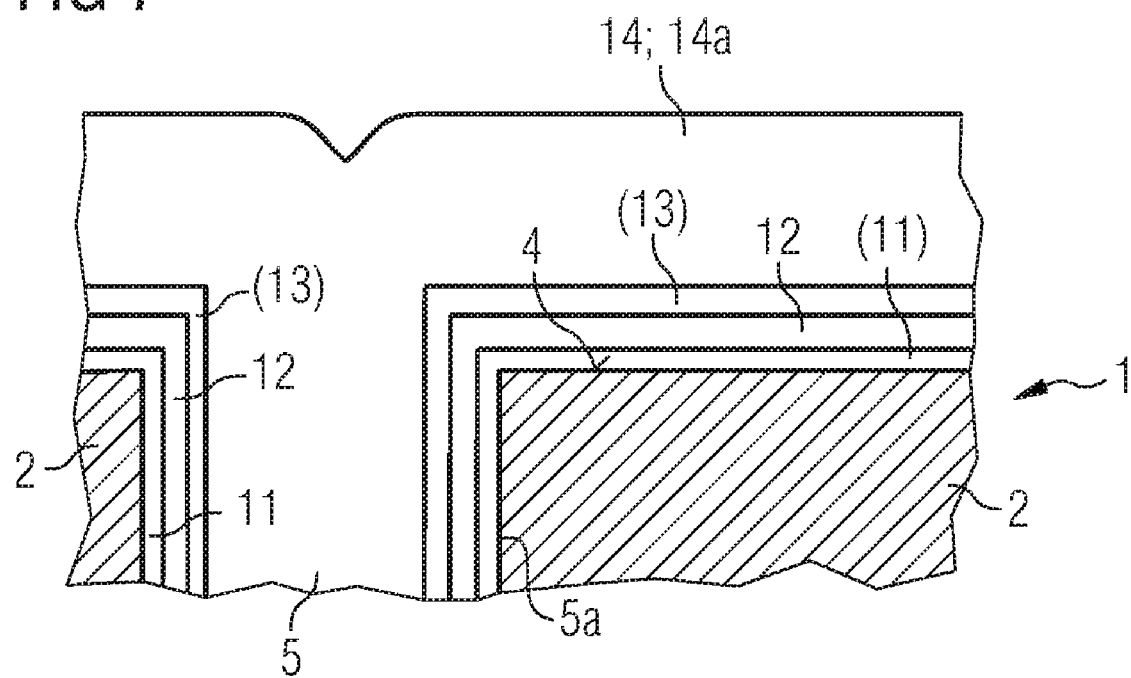

The implementation and the result of this deposition are illustrated schematically in FIGS. 6 and 7. In this exemplary embodiment, the deposition of the second layer 14 is preferably effected by means of an electrolytic deposition (FIG. 6). In addition, a preceding deposition step for forming a growth seed layer 15 can be provided, as will also be explained later with reference to FIGS. 21 and 22. In this case, a thin layer composed of the second material 14 and having a thickness of just a few atomic layers can be deposited, for example, deposited with a layer thickness of less than about 3 nanometers, before the main portion of the second material is deposited on the growth seed layer 15 (the growth seed layer preferably comprises copper and is preferably deposited by means of a physical vapor deposition). In all the embodiments and exemplary embodiments of this application including the drawings, it should be emphasized that the deposition of the second material, even if described in each case only with regard to the (preferably electrolytic) deposition of the second material, can always additionally comprise the preceding method step for forming the growth seed layer.

The second material 14a (FIG. 7), which is deposited completely or predominantly electrolytically in accordance with FIGS. 6 and 7, serves for filling the trench 5 of the semiconductor product 1 and closing it. On account of the electrically conductive first layer 12 deposited previously, the trench wall 5a of the trench 5 is covered in electrically conductive fashion and is coated during the electrolytic deposition with the second material 14a from which the second layer 14 is formed. In addition, the second material 14a is deposited onto the outer area of the semiconductor product 1 outside the trench 5, whereby the second layer 14 forms there as well.

As illustrated in FIG. 6, when implementing the electrolytic deposition, the semiconductor product 1 is, for example, connected to a cathode and thereby negatively biased. By way of example, an electrode 20 composed of copper or composed of some other copper-containing material is used as the anode, which is positively biased. The voltage source formed from anode terminal 18 and cathode terminal 19 enables an electrochemical or electrolytic deposition. The copper-containing electrode 20 connected to the anode terminal 18 serves as anode and the semiconductor product 1 connected to the cathode terminal 19 serves as cathode. The semiconductor product 1 and the copper-containing electrode 20 are dipped into a suitable electrolyte, for example, a copper sulphate solution (copper sulphate dissolved in water; $CuSO_4.H_2O$ in aqueous solution). However, the electrode 20 and the electrolyte need not contain copper; it is likewise possible for some other material to be deposited electrolytically. On account of the first layer 12 composed of conductive material 12a arranged on the semiconductor substrate 2, and if appropriate the second interlayer 13 composed of likewise conductive material arranged above the first layer, the second material 14a for the second layer 14 is also grown on the front-side surface 4 of the semiconductor product 1 including the trench inner wall 5a, to be precise at least until the trench 5 is completely filled. In this case, the second material 14a grows onto the bottom and the sidewalls of the inner wall 5a (and also onto the surface 4 of the semiconductor product 1 outside the trench 5). In the exemplary embodiment of FIGS. 1 to 12, it is possible, for example, for copper or some other material to be grown electrolytically. The width and the depth of the trench decrease during the growth until the trench is completely closed.

In this way, the form of the front-side outer area of the semiconductor product that is illustrated schematically in FIG. 7 arises, in which the trench is completely filled with the material 14a of the second layer 14. The top side of the second layer 14 runs at a level above the surface 4 of the original semiconductor product and above the previously deposited layers 12 or 11 to 13.

Figure 8:
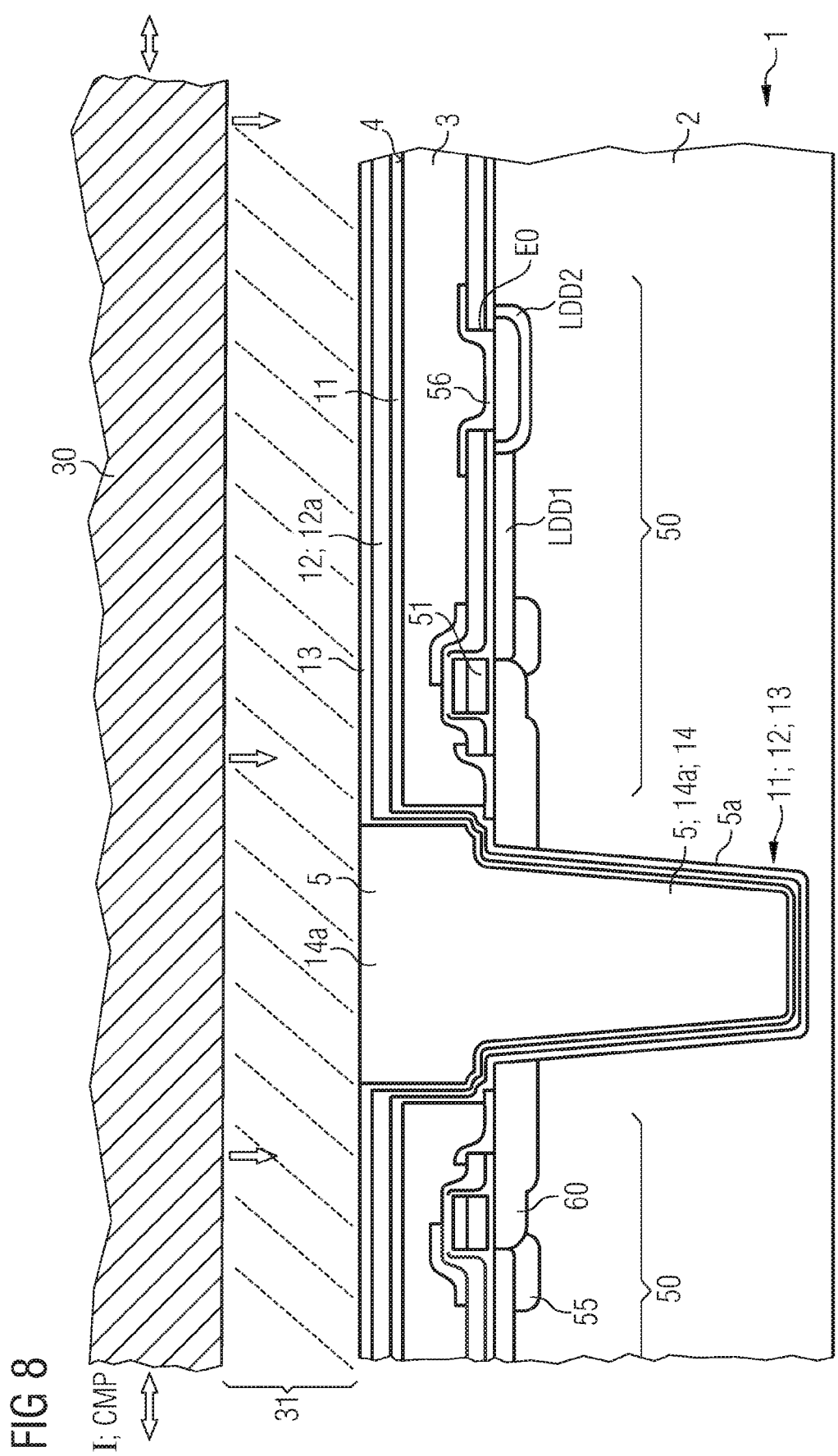

In accordance with FIG. 8, the excess material 14a of the second layer 14 is then removed outside the trenches, to be precise preferably by chemical mechanical polishing in this exemplary embodiment. In this case, a polishing pad 30 in the presence of a polishing slurry 31 is moved parallel to the main area of the semiconductor product 1 in order to remove the second material 14a from the top side of the semiconductor product. A chemical etching by chemical action of the polishing slurry and at the same time a mechanical abrasion by the polishing grains additionally contained in the polishing slurry take place in this case. The polishing slurry can, for example, substantially contain iron nitrate or some other iron-containing etching component. By means of the chemical mechanical polishing, the second layer 14 is removed relative to a layer lying under it, for example, relative to the first layer 12 or relative to the second interlayer 13.

In this way, for example, a second layer 14 comprising copper or a copper-containing material can be polished outside the trench 5. For this purpose, a first polishing step I can be carried out, for example, in which the copper of the second layer 14 is removed selectively with respect to a tantalum-containing second interlayer 13.

Figure 9:
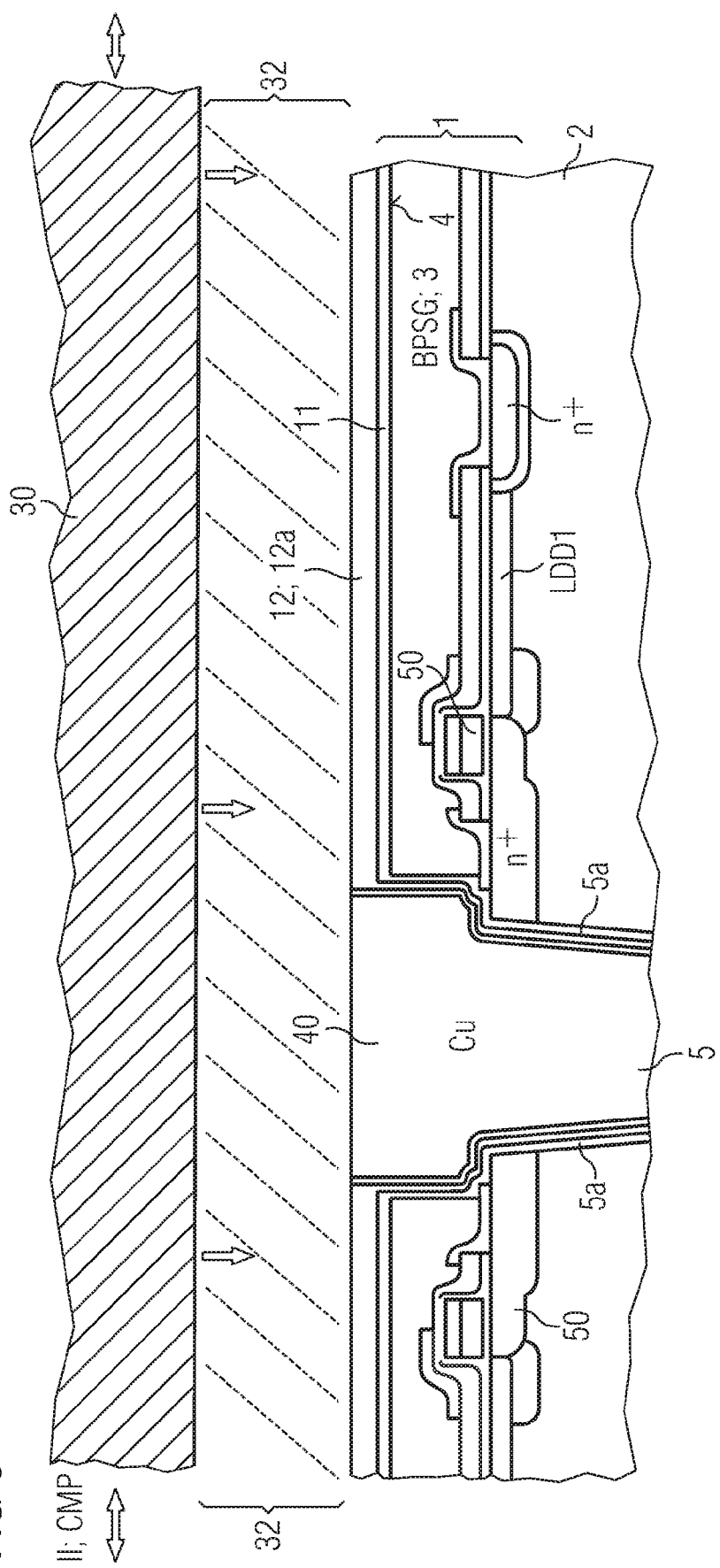

Afterwards, as illustrated in FIG. 9, a second polishing step II can optionally be provided, by means of which an optional second, for example, tantalum-containing, interlayer 13, which also served as an etching stop or polishing stop during the first polishing step I in the course of polishing the second layer 14, is removed selectively with respect to the first layer 12. The implementation of the second polishing step II can be carried out with the aid of a different polishing slurry 32 from the polishing slurry 31 of the first polishing step I.

FIG. 9 shows that the result of the second polishing step II with the aid of the polishing slurry 32 or, if the second interlayer 13 was not deposited and only the second layer 14 was polished later, the first layer 12 is uncovered after carrying out the polishing operation. A trench filling 40 composed of the second material 14a remains within the trench 5 and closes the trench. Outside the trench, by contrast, the first layer 12 (for example, composed of tungsten) is at least uncovered. In the context of this application, the formulation that the first layer 12 is "at least uncovered" means, in particular, that in regions outside trenches 5 (of which only one trench is illustrated by way of example in the figures), the first layer 12 is uncovered over the whole area or, if the first layer 12 has already been etched through or polished through in places, a layer arranged underneath it is uncovered. No material of a second interlayer 13 or of the second layer 14 should be situated on the first layer 12 if the latter has been uncovered at least outside the trench 5, not even in places. Consequently, the chemical mechanical polishing (including an "overpolishing") should be continued until, on the entire wafer surface, the first layer 12 or at most in places a layer arranged underneath it is uncovered at the top side of the semiconductor product that has been subjected to chemical mechanical polishing.

In the exemplary embodiment described up to this point, a relatively thick layer 14 composed of, for example, copper or a copper-containing second material 14a serving for filling the trench 5 was firstly deposited onto the semiconductor product (namely onto the layer 12 or 13) and subsequently removed again at a level above the trench 5 by chemical mechanical polishing. Depending on the magnitude of the layer thickness and depending on the choice of materials for the polishing slurry and the second layer 14, under certain circumstances a relatively long time duration of several minutes may be required for polishing in order to completely remove the second layer 14 at a level above the trench. On account of predetermined boundary conditions in the production of integrated semiconductor circuits, depending on the application polishing durations of 1000 seconds or more may arise, which are required in order that, for example, a copper layer 14 deposited electrolytically above a tungsten layer 12 is removed completely outside trenches 5.

Given such long polishing times, unevennesses can arise on account of the polishing operation and are transferred during the further processing of the semiconductor substrate and impede the process windows for subsequent production steps, for example, in particular for lithographic patternings with limited depth of focus. Therefore, it is desirable to re-establish the initially very planar surface of the semiconductor product also after the deposition of the layers 12, 14 and the subsequent elimination thereof outside the trenches. However, the top side, illustrated in FIG. 9, of the first layer 12, which is uncovered after the chemical mechanical polishing of the second layer 14 (and if appropriate of a second interlayer 13), will quite generally have unevennesses on account of the long polishing times, that unevennesses cannot be eliminated even by further polishing of the first layer 12 (and if appropriate a first interlayer 11). Therefore, in the course of removing layers which were deposited in trenches 5, topographies arise on the surface of the semiconductor product or in the topmost layer (the layer 12 in FIG. 9) arranged thereon, which topographies cannot readily be eliminated by conventional methods.

The materials specified here for the layers 11, 12, 13 and 14 are moreover mentioned merely by way of example; it goes without saying that other materials can likewise be used. Furthermore, in particular, one or both interlayers 11, 13 can be obviated. If need be the first and the second layer 12, 14 are provided for the method according to an embodiment of the invention, the second layer 14 typically having after deposition a layer thickness that is significantly greater than the layer thickness of the first layer 12. By way of example, the layer thickness d2 of the first layer 12 can be between 50 and 200 nm, for example 80 to 100 nm, whereas the layer thickness d4 of the second layer 14 on the uncovered surface of the semiconductor product outside the trenches 5 can be, for example, between 3 and 10 μm. The polishing times required for polishing back to the second material 14a are correspondingly long, particularly when the material that is actually best suited with regard to a highest possible polishing rate cannot be used owing to other boundary conditions in the production of integrated circuits and a polishing slurry having a lower polishing rate has to be used instead. In particular copper or a material that principally comprises copper is suitable as material 14a for the trench filling of the trenches 5 that is to be formed with the aid of the second layer 14. These materials can be used in particular to produce contact hole fillings serving as vias. It is likewise possible to produce interconnects above a substrate surface or electrical substrate contacts which reach either as far as the surface or right into the interior of the substrate or even as far as the rear side of the substrate. With the aid of trench fillings of trenches 5 which pass through the entire layer thickness of the substrate 2, it is possible, for example, to produce rear-side contact-connections, that is to say contact-connections of electrical components on the substrate front side from its rear side. In this way, it is possible to produce thermal contacts serving for heat dissipation, or else electrical contacts, in particular substrate contacts or substrate rear-side contacts. It is likewise possible for trenches to be produced and filled with trench fillings which are required when a plurality of semiconductor substrates are stacked one on top of another, for the electrical contact-connection and driving of all the semiconductor substrates involved. Moreover, the substrates which are provided with trenches and trench fillings to be introduced therein can also subsequently be thinned from the rear side and, after thinning, such a trench filling can extend as far as the then uncovered substrate rear side (or else then also end in the interior of the thinned substrate).

Copper, which was mentioned above as a possible material for the second layer 14, is suitable for forming any desired electrical connections such as contacts, interconnects, etc., owing to its high conductivity and integration capability. Tungsten as a material or at least a main material for the first layer 12, by contrast, is suitable as a diffusion barrier preventing copper from diffusing into the silicon.

The second interlayer 13 can likewise be used as a diffusion barrier layer for avoiding copper diffusion and is preferably likewise electrically conductive. It can be formed in particular from tantalum and/or tantalum nitride. The first interlayer 11, which can optionally be formed between the substrate 2 and the first layer 12, can comprise, in particular, a titanium layer; this serves, in particular, for enhancing the adhesion and/or the electrical contact of the second layer 12 with the substrate material (for example, of tungsten on silicon); the first interlayer 11 is preferably likewise electrically conductive and preferably likewise comprises a diffusion barrier that prevents in particular the material of the first layer 12 (in particular tungsten) from diffusing into the substrate material (for example, silicon). In particular, the first interlayer is intended to prevent a chemical reaction of tungsten with the substrate material (for instance with silicon, whereby tungsten silicide would arise). For this purpose, the first interlayer can comprise a titanium nitride layer, which prevents the siliciding of tungsten also during later heat treatment steps.

The materials specified here by way of example are suitable in particular in order to completely fill trenches having a high aspect ratio without voids arising. At the same time, the layer materials used can be removed again from the surface of the semiconductor product without topographies caused by polishing steps remaining. This will be explained in more detail with reference to the further figures.

As specified above, in accordance with FIG. 8, the material 14a of the second layer 14 is removed from the top side of the semiconductor product 1 covered with the layers 12 or 11 to 13. In this case, the chemical mechanical polishing can be carried out until, over the whole area on the semiconductor substrate (at least outside the trenches 5), at least the first layer 12 is uncovered (or, without being a significant disadvantage for the invention, if appropriate etched through in places). However, after the chemical mechanical polishing at the uncovered top side of the semiconductor product, the first layer 12 (or otherwise in places an underlying layer 11, 3, 13 or the substrate 2) should be uncovered.

The operation used previously for polishing the second layer 14 can comprise a first polishing step I, as illustrated in FIG. 8, in which, with the aid of a first polishing pad 30 and a first polishing slurry 31, the material 14a of the second layer 14 is completely removed above the trenches 5. In this case, the second interlayer 13 can serve as an etching stop or polishing stop, the material of the second interlayer can be selected according to its suitability as an etching stop or polishing stop. In particular tantalum and tantalum nitride can be used here. In particular a polishing slurry containing iron, for instance a polishing slurry containing iron nitrate or based on iron nitrate, can be used as polishing slurry 31 for the removal of the second layer 14. When a polishing slurry based on iron nitrate is used, the second interlayer 13 serves in particular for providing a whole-area polishing stop that prevents a situation where in places during polishing in the presence of polishing slurry containing iron nitrate, the underlying tungsten (or material used otherwise) with respect to the first layer 12 is already uncovered; in such a case, an electrochemical element would form between the materials of the first and second layers 12, 14, which could possibly result in superficial corrosion and detachment of the (if appropriate copper-containing) filling from the trench wall. The polishing operation carried out for uncovering the first layer 12 can furthermore comprise a second polishing step, which is carried out using a different polishing pad 30 and in the presence of a different, second polishing slurry 32, as illustrated in FIG. 9. Preferably, a polishing slurry based on hydrogen peroxide, which, if appropriate, also contains ammonia as an additive in dissolved form, is used in this case. (The concentration of hydrogen peroxide and, if appropriate, also ammonia in polishing slurries used in the course of one of the methods according to embodiments of the invention for etching the layers composed of titanium, titanium nitride, tungsten, tantalum or tantalum nitride is, however, significantly lower than in an etching solution which is used for wet etching and by means of which in particular residues of the first layer 12 are removed.) By means of the second polishing step II, the second interlayer 13 is removed relative to the first layer 12. Over the whole area on the semiconductor wafer wherever no trench fillings of trenches 5 composed of the material of the second layer 14 are provided, the first layer 12 is uncovered at the latest by means of the second polishing step II. In accordance with certain topographies that arose as a result of the polishing of the second layer 14 and an over-polishing required as a result, generally everywhere a certain proportion of the first layer 12 will be removed and under that a residue of the first material 12a, from which the first layer 12 is formed, will remain. In places the first layer 12 can even also be polished through if the topographies are very large. In any case, however, by means of the chemical mechanical polishing (at the latest after the second polishing step II), the material of the first layer 12 will largely form the top side of the semiconductor product 1 that has been processed up to that point. On account of the topographies, however, which was required on account of the complete polishing of the second layer 14 having a larger layer thickness d4, unevennesses, that is to say topographies within the layer thickness of the then uncovered first layer 12, will generally have arisen. Therefore, the top side of the semiconductor product 1 is no longer planar. If the remaining layers 12 and, if appropriate, 11 were then removed merely by further continuation of the polishing operation, the unevennesses would merely be transferred into the next deeper layer, for example, a dielectric layer 3, or into a substrate 2 itself. The process window for subsequent processing steps, in particular those with lithographic patterning, would thereby be reduced. This is prevented, however, by the further measures explained with reference to the subsequent figures. FIG. 9 shows, moreover, on the underside of the semiconductor product 1, that the trench 5 reaches as far as the opposite main area and thus enables through-plating of the semiconductor product 1. All the embodiments can be embodied with through-plating trenches or trenches that pass through only a portion of the layer thickness of the semiconductor product (or of the substrate or of a layer arranged thereabove).

The removal of the second interlayer 13 by means of a second polishing step II as illustrated in accordance with FIG. 9 can be carried out, for example, with the aid of a polishing slurry 32 containing hydrogen peroxide and optionally also additionally ammonia. It is also possible to use any other polishing slurry, preferably based on hydrogen peroxide. Although the surface of the uncovered first layer 12 is illustrated as planar in FIG. 9, unevennesses may have arisen as a result of the polishing of the first layer 12 (in particular in the case of a first layer 12 containing tungsten or formed from tungsten) in the surface of the semiconductor product then present, since generally sufficiently uniform planarization is no longer possible owing to the lengthy polishing process for removing the first layer 12. Thus, by way of example, a polishing duration of approximately 1000 seconds may be required for removing a first layer 12 formed from tungsten (by means of chemical mechanical polishing), whereas a second layer 14 formed from copper, for example, is already polished through in 90 seconds and a tantalum-containing second interlayer 13 is already polished through after 150 seconds.

Consequently, the vertical position of the top side of the semiconductor product 1 that has been processed up to that point varies over the entire wafer area; that residue of the first material 12a of the first layer 12 has a residual layer thickness that can vary greatly over the wafer surface. In places the first layer 12 can also be completely polished through and an underlying layer 11 or 3 can already be uncovered, depending on the extent of the unevennesses that arose as a result of the polishing of the second layer 14.

Figure 10:
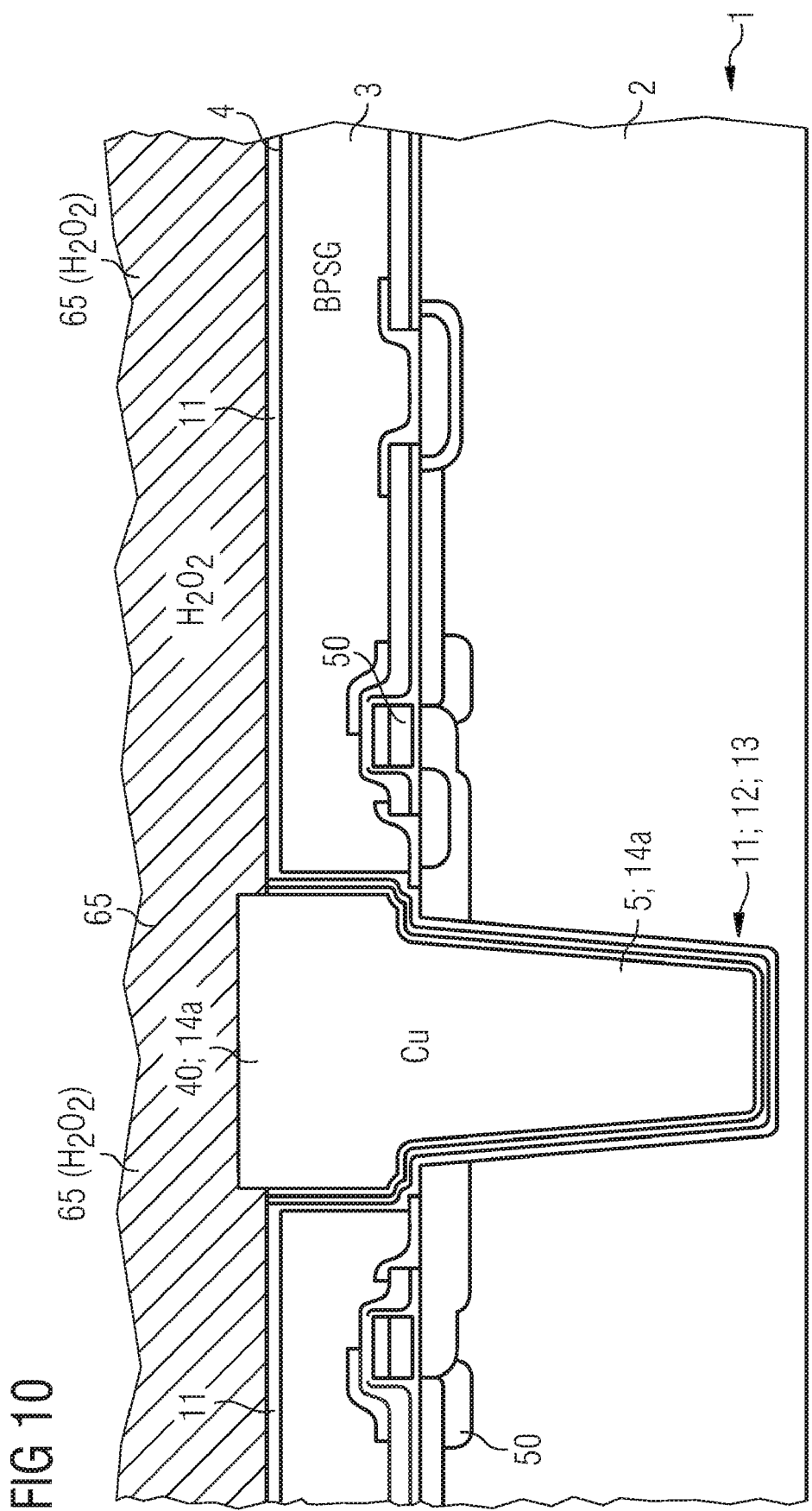

According to an embodiment of the invention, the residue of the first material 12a of the first layer 12 is then removed by means of a wet etching, as illustrated in FIG. 10. The wet etching is effected, for example, with the aid of hydrogen peroxide, or otherwise with any desired etching solution 65 that removes residual material 12a of the first layer 12, to be precise preferably selectively with respect to an underlying layer such as, for example, the first interlayer 12 or the dielectric layer 3 (composed of, for example, BPSG; borophosphorus silicate glass). The etching solution used for the wet etching of the first layer 12 can contain in addition to hydrogen peroxide also additionally ammonia in dissolved form. Preferably, the wet etching is carried out selectively with respect to the first interlayer 11 or, if a first interlayer 11 is not present, selectively with respect to the material at the surface 4 of the semiconductor product 1. Unevennesses that are still present up to that point and are manifested by a layer thickness of the residual material of the first layer 12 that varies over the substrate area are eliminated as a result; after the selective removal of the first material 12a, the top side of the first interlayer 11 or, if a first interlayer 11 was not present, the surface 4 of the semiconductor product 1 is uncovered again; topographies and unevennesses still present previously have been eliminated by the wet etching of the residual material of the first layer 12.

At most the trench fillings 40 formed from the material of the second layer 14a can project slightly above the surrounding top side of the semiconductor product. They can be superficially attacked and oxidized by the wet etching. In particular it is possible, though this is not depicted in the illustration in FIG. 10, for the uncovered surface of the trench filling 40 to be superficially oxidized by the etching solution 65 used during the wet etching. By way of example, the surface of a trench filling 40 formed from copper Cu can be superficially oxidized if the etching solution 65 contains hydrogen peroxide (and, if appropriate, additionally ammonia). Without additional mechanical action such as during chemical mechanical polishing, this oxide layer is retained on the trench filling 40. However, this can be concomitantly removed in a subsequent polishing step for removing the first interlayer since, in the case of a polishing slurry formed from hydrogen peroxide and ammonia, for example, an external copper oxide layer is eroded as soon as the chemical action is supported by mechanical abrasion on account of the polishing pad.

Figure 11:
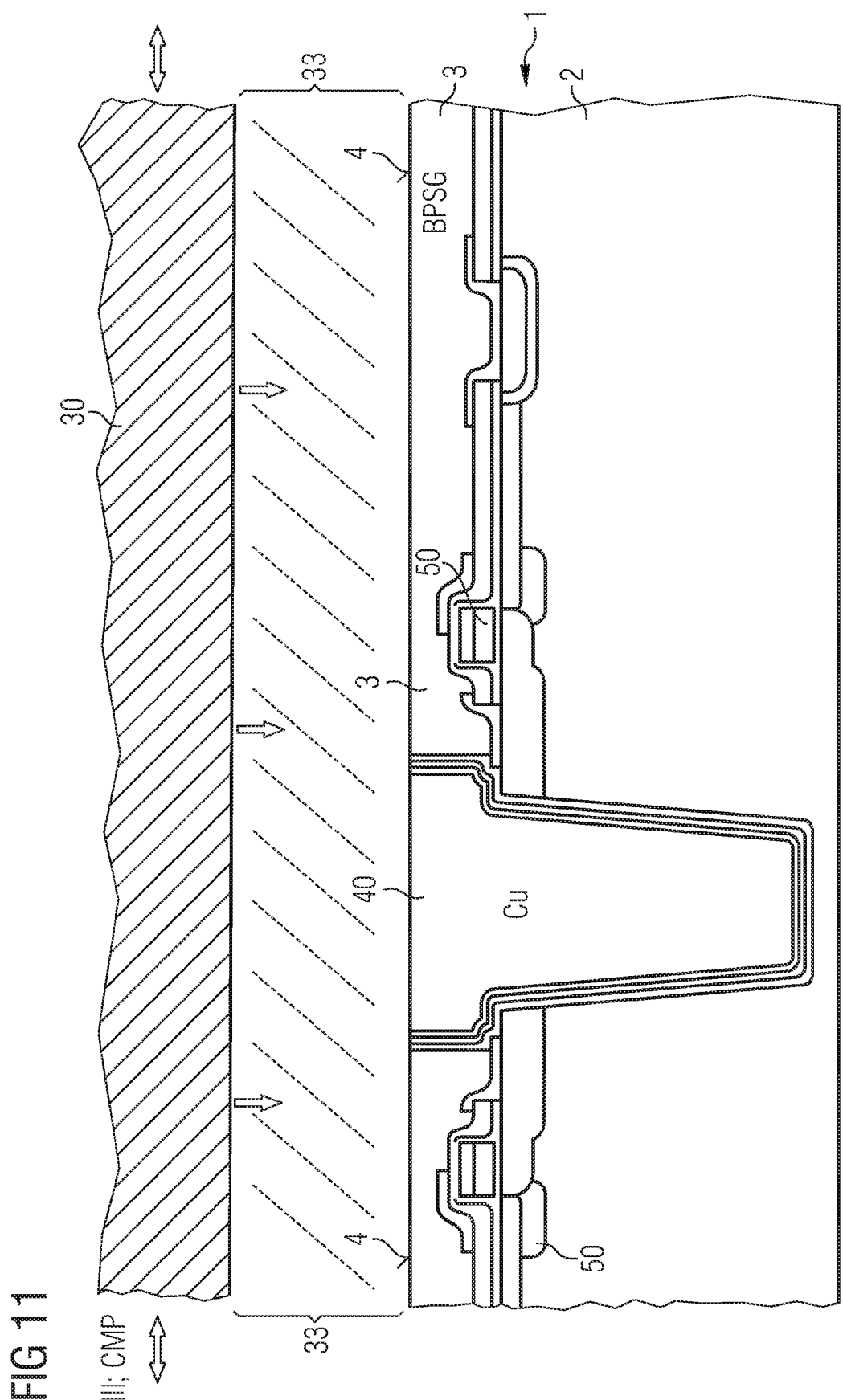
Figure 12:
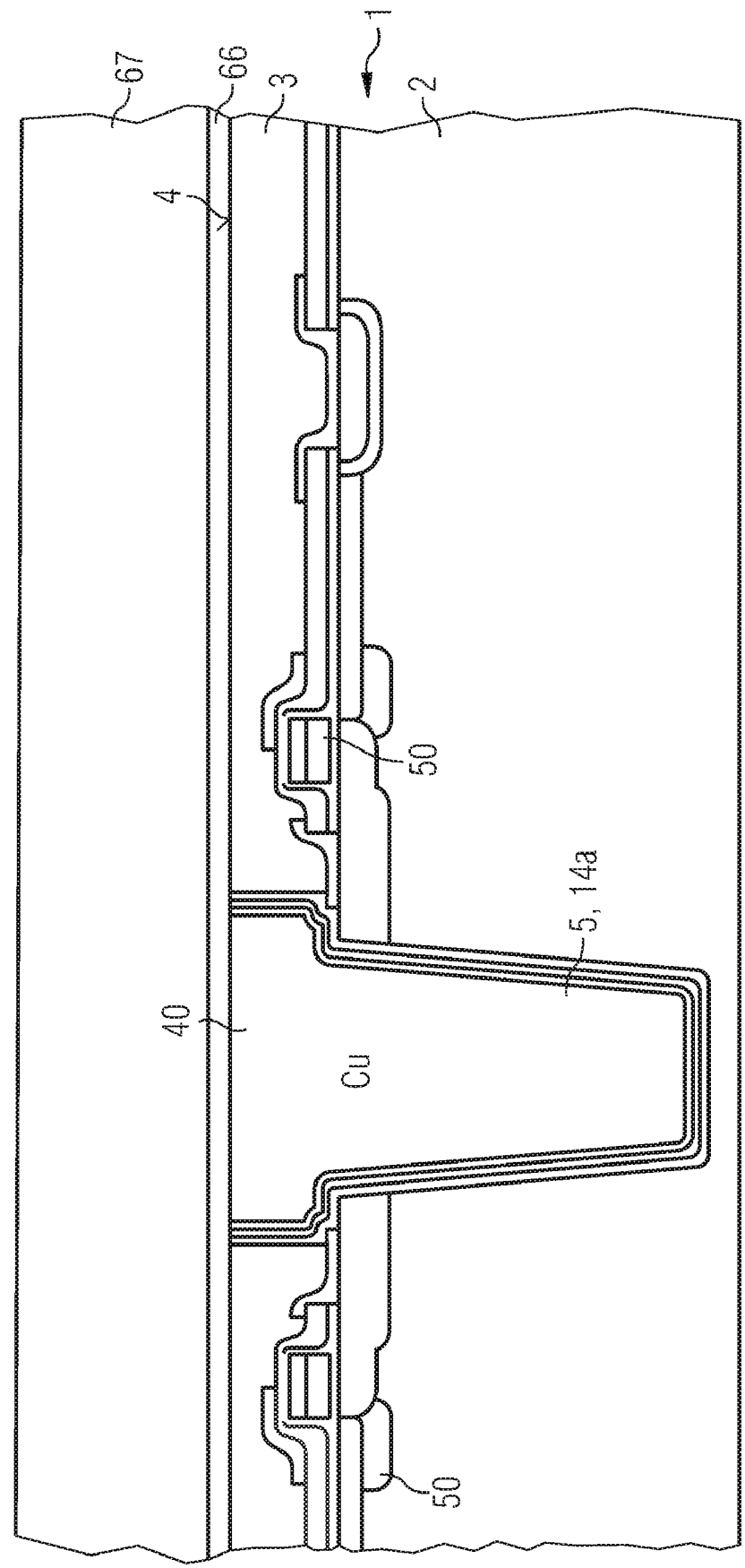

In accordance with FIG. 11, finally, the first interlayer 11 is removed from the surface 4 of the semiconductor product 1, to be precise preferably by means of a further polishing step III of the chemical mechanical polishing CMP. This involves using a further or identical polishing pad 30 in the presence of a further polishing slurry 33. In the same way as the polishing slurry 32 of the second polishing step II or the etching solution 65 of the wet etching, the polishing slurry 33 can contain hydrogen peroxide and, if appropriate, additionally ammonia in dissolved form. In this case, not only is the first interlayer removed selectively with respect to the dielectric layer 3, but an oxide layer (in particular copper oxide) formed superficially on the top side of the trench filling 40 is also removed by the additional mechanical action. Afterwards, the substrate surface 4 which is highly planar as before and is practically free of topographies is uncovered again, which enables a further rework of the semiconductor product with a large process window for subsequent processing steps. Consequently, all the topographies that arose as a result of polishing processes for removing the layers 11 to 14 have been eliminated again.

With the aid of the optionally provided second and third polishing steps, in particular tantalum-containing interlayers 13 and titanium-containing interlayers 11 can be removed selectively with respect to the respectively underlying layer. During the wet etching, the same solution can be used for the etching solution 65 as was already previously used during the second polishing step for removing the second interlayer 13 (although without polishing grains or at least without mechanical action); the purely chemical etching without mechanical abrasion eliminates residual first material 12a of the first layer 12 independently of its local layer thickness.

For test purposes, a further layer sequence can be deposited on the semiconductor product 1 thus treated in accordance with FIG. 11, in order to perform further measurements. Thus, by way of example, in accordance with FIG. 12, firstly a first measurement layer 66 composed of silicon nitride, for example, can be deposited onto the uncovered surface 4 of the semiconductor product 1. The first measurement layer 66 can have, for example, a layer thickness of about 100 to about 300 nm. A second test layer 67, for example, composed of silicon oxide, can be deposited onto the first measurement layer 66. The second test layer 67 can have, for instance, a layer thickness of about 2 to about 3 µm. These indications are by way of example, of course. The first measurement layer 66 composed of silicon nitride can be provided, for example, in order to prevent copper from diffusing into the second test layer 67. The processing steps and subsequent layer thickness measurements or height measurements performed for test purposes can be carried out both on a wafer provided for production and on a dedicated test wafer. Likewise, on a single wafer, it is possible to provide circuits which are provided for a semiconductor chip to be produced, and additionally test structures which serve for height measurement and thus for checking the planarity of the wafer. The test structures can be provided in particular in the sawing frame, the so-called "kerf".

Figure 13:
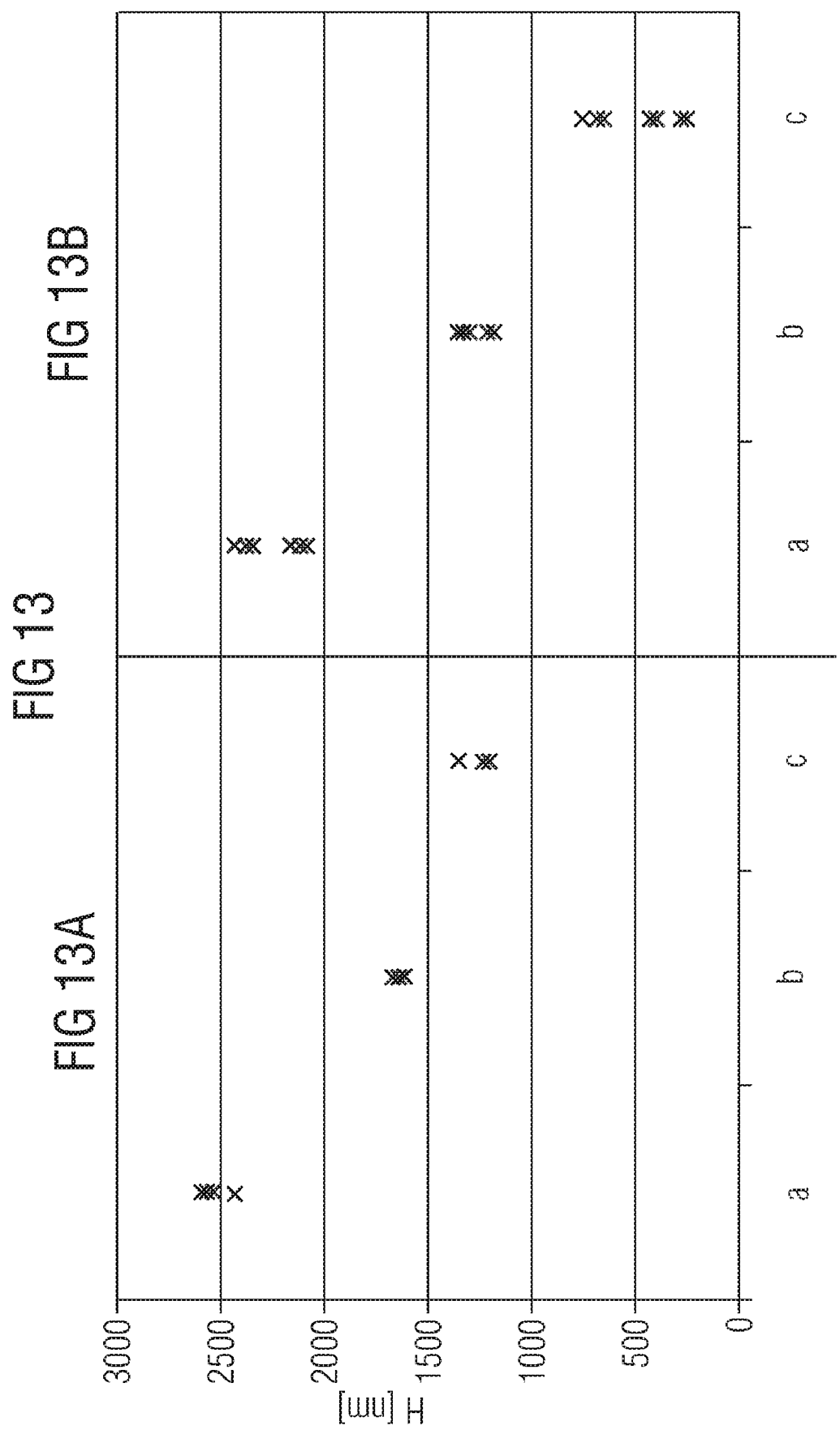
FIG. 13A and FIG. 13B, shown collectively as FIG. 13, and FIG. 14 show measurement results with regard to the improved planarity owing to the method according to an embodiment of the invention in accordance with the embodiment.

FIG. 13 summarizes a plurality of height measurements at different test structures that were performed for test purposes. In FIG. 13A (left-hand half of FIG. 13), results of in each case nine individual height measurements are plotted for three different measurement points a, b, c. An absolute height measured in nanometers is specified in each case. In the case of the measurement point a, the layer thickness of the second test layer 67 was measured over a test structure, to be precise over a plate-type structure formed in a similar manner to the drain contact layer 56 in FIG. 5. In accordance with FIG. 13A, measured values that lie very close to one another in the region of 2500 nm are produced. In comparison with this, FIG. 13B shows for the measurement point a that the measured values have a greater variation relative to one another (from approximately about 2100 to about 2400 nm) if they are measured at a second test layer 67 on a semiconductor product processed by a conventional method. The greater variation of the measured values is a consequence of the elimination of the layers used for filling the trenches 5, the elimination being performed solely by means of chemical mechanical polishing; topographies that arose as a result of the long polishing times therefore affect subsequently deposited layers like the second test layer 67.

For the measurement point b, too, the comparison between FIGS. 13A and 13B shows that the variation of the measured values is smaller in the case of the method according to an embodiment of the invention in accordance with FIG. 13A. The measurement point b was based on a layer thickness measurement (performed for instance by means of an optical ellipsometry) of the dielectric layer 3 (preferably composed of BPSG), to be precise once again over the "plate bottom" of a structure formed in a similar manner to the drain contact layer 56 illustrated in FIG. 5. However, measurement was effected at a drain contact layer 56 arranged in the sawing frame in a respective test structure, i.e., outside the respective circuits for the semiconductor chips that are actually to be produced. Nine such test structures with a structure formed in an identical manner to the drain contact layer 56 were brought together for the measurements as measurement point b.

Finally, the measurement point c was based on a layer thickness measurement likewise of the dielectric layer 3 (BPSG), but over the "plate edge" of a structure formed in a similar manner to the drain contact layer 56 illustrated in FIG. 5. For the measurement point c, too, the comparison of FIGS. 13A and 13B reveal a smaller variation of the measured values in the case of the method according to the invention, i.e., in FIG. 13A.

Figure 14:
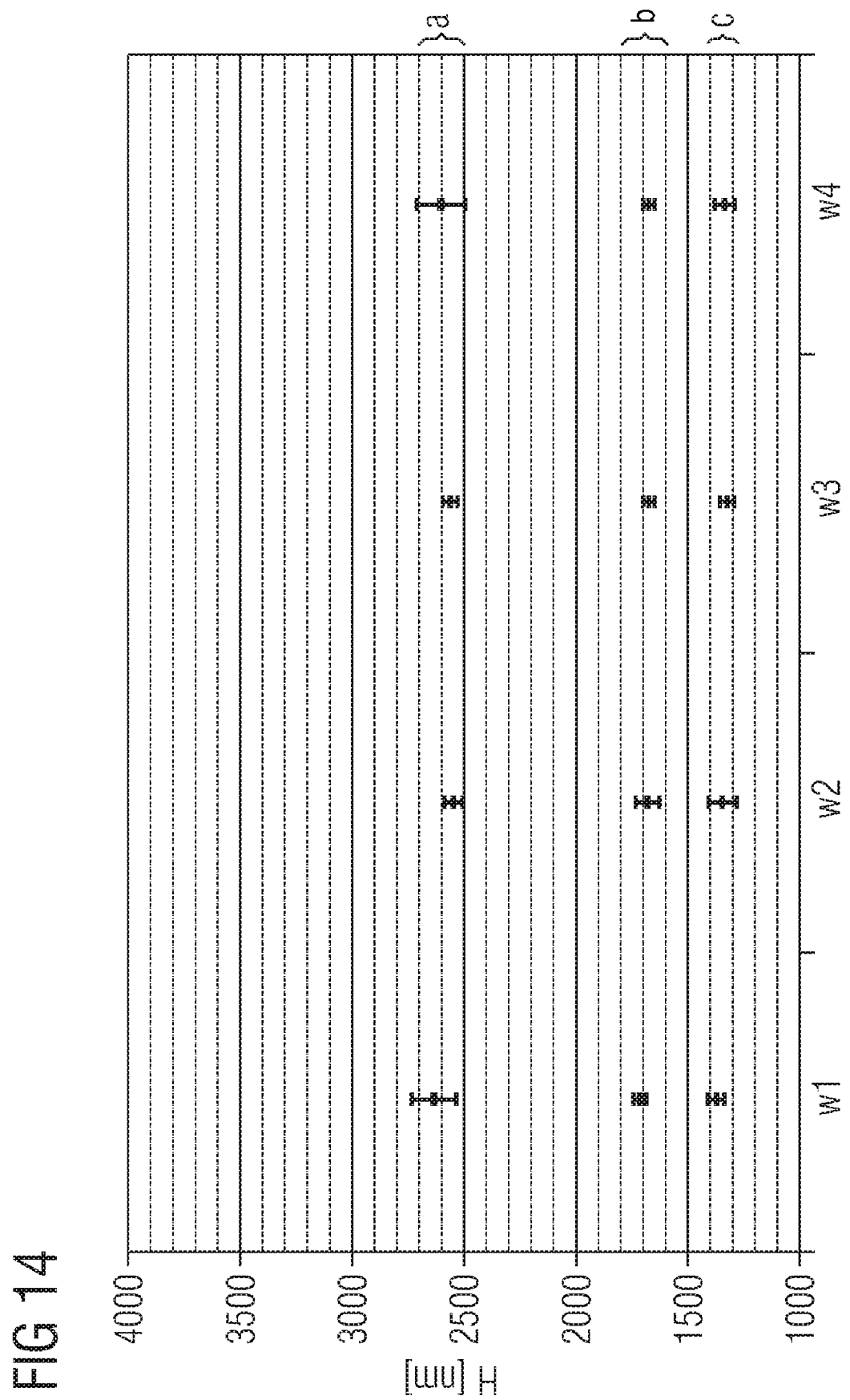

Finally, FIG. 14 shows, for various selected test wafers w1, w2, w3, w4, the results of layer thickness measurements, which were obtained at a semiconductor product reworked by the method according to an embodiment of the invention after the two measurement layers 66, 67 have been formed. The measurement points a to c correspond to the measurement points a to c in FIG. 13. In the case of four measured test wafers w1, w2, w3, w4, the average value of the measurements for the measurement point a varies with mainly small variation around a height H of approximately 2500 nm. Only small variations around the average height values of approximately 1700 nm and 1350 nm likewise result for the measurement points b and c, respectively, which reflects the high planarity of the semiconductor product processed by the method according to the invention. Consequently, with the aid of the method according to an embodiment of the invention, the layers deposited on account of the filling of trenches can be removed from the surface of a semiconductor product without topographies remaining which were caused by the polishing processes used.

FIGS. 15 to 20 show a further exemplary embodiment of a method according to an embodiment of the invention.

Figure 15:
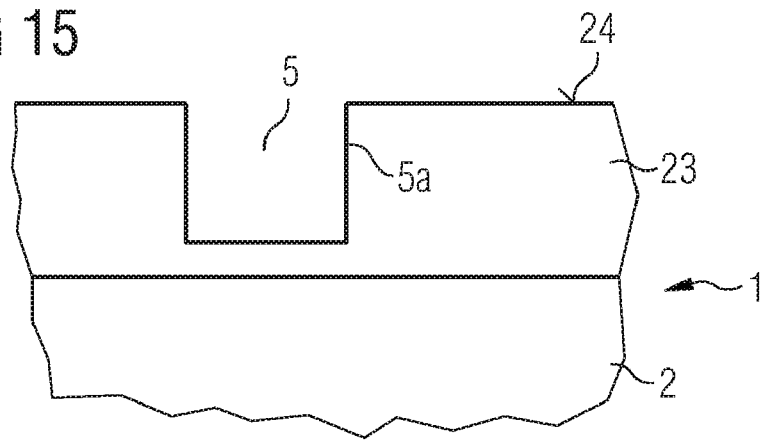

In accordance with FIG. 15, a trench 5 is etched into the surface 24 of a semiconductor product 1 having a substrate 2 and a dielectric layer 23 above the substrate 2. The trench need not reach right into the substrate or as far as the substrate surface of the substrate 2, but rather can end within the layer thickness of the dielectric layer 23. The trench can serve, for example, for producing interconnects and/or contact hole fillings in accordance with a (dual) Damascene technique.

Figure 16:
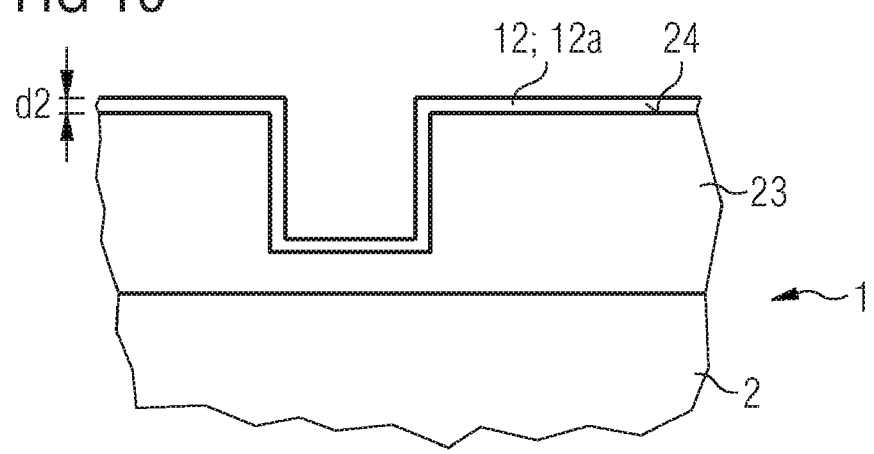

In accordance with FIG. 16, at least one first layer 12 is deposited, which is preferably electrically conductive. The first layer 12 comprises a first material 12a, but can also comprise a layer sequence. By way of example, further layers, for instance interlayers such as the interlayers 11 and 13 of the exemplary embodiment of FIGS. 1 to 12, can be deposited before and/or after the deposition of the first layer 12, where the deposition techniques described there can in each case be used (in the same way as for the first layer 12 itself). The first layer covers both the trench wall and the surface 24 of the semiconductor product 1 outside the trench 5.

Figure 17:
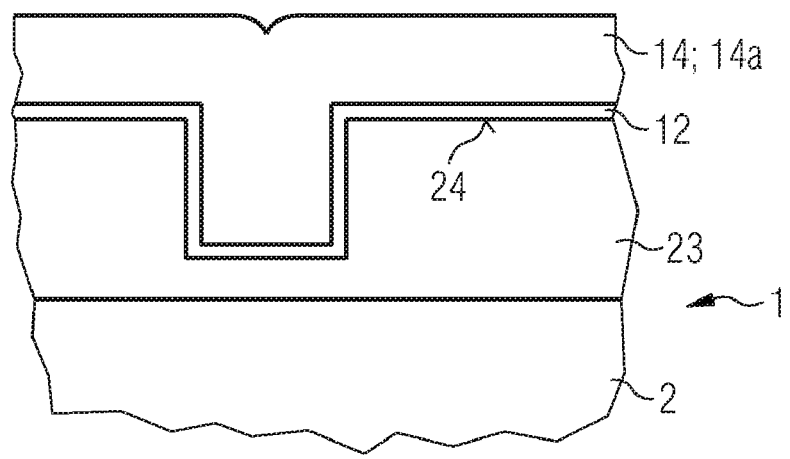

In accordance with FIG. 17, a second material 14a is then deposited, whereby a second layer 14 is formed on the first layer 12 and the trench 5 is filled with the second material 14a. The second material is preferably (but not necessarily) deposited electrolytically. The second material can preferably predominantly contain copper.

In accordance with FIG. 18, the second material 14a is etched back as far as the top side of the first layer 12 outside the trench 5. The etching back can be carried out by chemical mechanical polishing (CMP) with the aid of a polishing pad 30 and a polishing slurry, which is merely indicated in FIG. 18. The entire polishing operation and also the materials used for the polishing slurry can be chosen, for example, as in the exemplary embodiment of FIGS. 1 to 12. As an alternative, however, it is also possible to choose other types of etching back. The etching back can also comprise a plurality of steps, wherein, for example, one of the plurality of etching-back steps is a polishing operation.

As a result of the etching back of the second material 14a, the second material 14a remains only in trenches 5, only a single one of which is illustrated in FIGS. 15 to 20 for the sake of clarity. This results in separate, preferably conductive structures which can be formed as interconnects and/or as via contact hole fillings. FIG. 18 shows the exemplary embodiment of a trench filling 40 composed of the second material 14a and formed as an interconnect 70, whereas FIG. 19 shows an alternative exemplary embodiment with a trench filling 40 formed as a via, i.e. as a contact hole filling 75. Therefore, in FIG. 19, the contact hole reaches as far as the top side of the substrate. All of FIGS. 15 to 20 relate to both of these embodiments.

FIG. 19 illustrates unevennesses of the top side of the first layer 12 after the etching back of the second layer 14, in order to illustrate the topographies which can arise in particular after carrying out a relatively lengthy previous polishing process. Of the original layer thickness d2 of the first layer 12 (FIG. 16), there remains after the etching back of the second layer 14 (which etching back can include a certain overetching into the first layer 12, but at least uncovers the first layer outside the trenches 5 at least) a remaining portion d1 of the original layer thickness d2 of the first layer. The remaining portion d1 of the layer thickness can vary over the area of a substrate, in particular of a wafer. The resultant height fluctuation of the top side of the uncovered first layer 12 is illustrated in FIG. 19 within local structure dimensions, wherein the layer thickness fluctuations are depicted with an exaggerated size for the sake of clarity. The resultant topographies cannot simply be removed by a (further) polishing operation, but rather would thereby be transferred into the underlying layer 23.

In accordance with FIG. 20, however, the residual material 12a of the first layer 12 is removed by means of a wet-chemical etching. As a result, all the residual material 12a of the first layer 12 is removed, independently of its layer thickness that is still present and varies over the wafer surface, to be precise preferably selectively with respect to a layer arranged underneath, for instance the dielectric layer 23. In this way, further processing steps including lithographic patternings can be performed above the interconnect level L without the process window being reduced on account of the topography that has arisen in the meantime during the removal of the second and first layers 14, 12.

Figure 21:
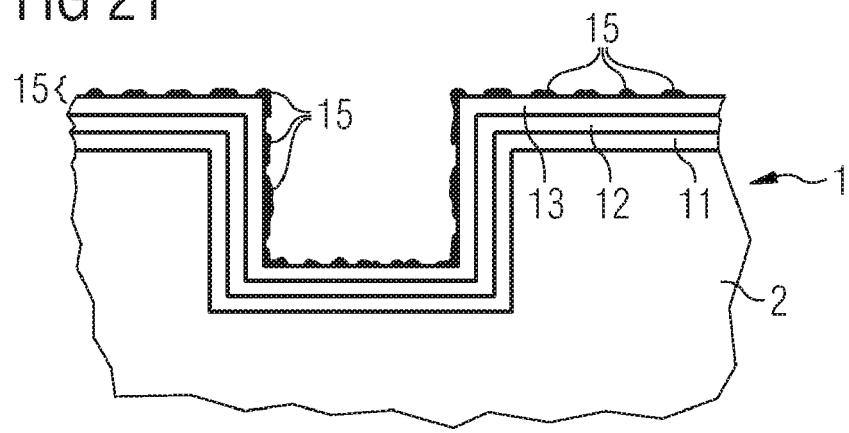
FIGS. 21 to 23 show a development with regard to the deposition of the second layer.
Figure 22:
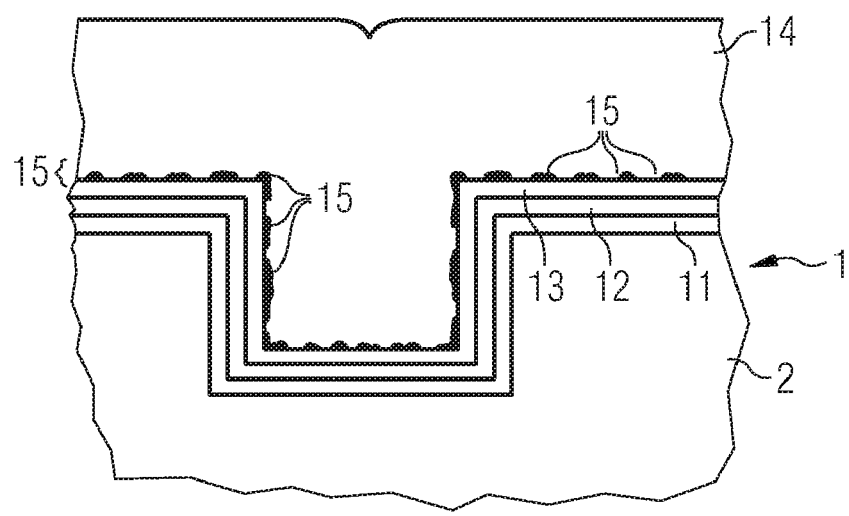
Figure 23:
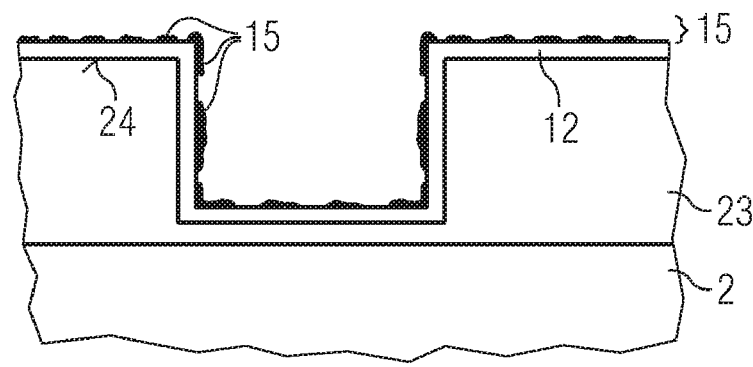

FIGS. 21, 22 and 23 show a development of the methods according to an embodiment of the invention with regard to the deposition of the second layer. FIGS. 21 and 22 are directed in particular towards the step of forming the second layer 14, the end result of which is illustrated in FIGS. 5 and 7, in which a layer 14 is arranged on an underlying layer, for instance the second interlayer 13. The deposition of the second material can comprise, in addition to a deposition of the main amount of the second material 14a, preferably by means of an electrolytic deposition, additionally a preceding step of forming a growth seed layer 15. Such a growth seed layer 15 serves for attaching individual growth seeds 15 on the surface of the underlying layer, on which the second material can then grow more reliably and at a higher deposition rate. The growth seed layer is illustrated with an exaggerated size in FIG. 21; in practice it need be only a few atomic layers thick. As illustrated in FIG. 21, it can also comprise isolated growth seeds that are not yet interlinked. Likewise, the growth seed layer can be a layer which, although it is already interlinked overall, is still perforated. It goes without saying that an uninterrupted, continuous growth seed layer is at least likewise suitable for accelerating the subsequent, preferably electrolytic growth of the second material 14a. The growth seed layer is preferably formed by a physical vapor deposition. Any other deposition methods can be used as an alternative. In accordance with FIG. 21, on account of the physical vapor deposition, growth seeds of the growth seed layer 15 form on the top side of the second interlayer 13 of the semifinished semiconductor product from FIG. 4. The seeds form on the top side both within the trench and outside the trench. The seeds preferably, but not necessarily, comprise the second material 14a, that is to say the material of the subsequently deposited second layer 14.

In accordance with FIG. 22, the second material 14a is subsequently deposited, for instance by means of the electrolytic deposition in accordance with FIG. 6. It is preferably deposited up to a layer thickness sufficient to completely fill the remainder of the trench volume. The second layer 14 is formed as a result. If the growth seed layer 15 is formed from the same material as the second layer 14, a layer boundary is no longer discernible between the layers 14 and 15 after the deposition of the second layer 14. Consequently, the second layer 14 then comprises the growth seed layer 15. Therefore, the growth seed layer 15 is no longer illustrated separately in FIGS. 5 and 7 and in the further figures.

FIG. 23 shows the corresponding development with regard to the additional deposition of the growth seed layer 15, but on the basis of the exemplary embodiment of FIGS. 15 to 20. A growth seed layer 15 is then optionally deposited onto the surface of the first layer 12 of the semifinished semiconductor product from FIG. 16 in a manner corresponding to the exemplary embodiments described above with reference to FIGS. 21 and 22. In particular, here as well a growth seed layer composed of the second material 14a can again be deposited. In all of FIGS. 21 to 23, the growth seed layer, in the same way as the second layer 14 itself, can comprise a copper-containing material, for example, copper. Furthermore, a physical vapor deposition is preferably chosen for depositing the growth seed layer 15.

The above-described exemplary embodiments of FIGS. 1 to 12, 15 to 20 and of FIGS. 21, 22 and 23 are mentioned merely by way of example; all of the individual steps and individual features of the exemplary embodiments and also of those exemplary embodiments of the patent claims can be combined with one another. Furthermore, further modifications emerge, moreover, upon application of the knowledge and abilities of a person skilled in the art.

What is claimed is:

1. A method for making a semiconductor device, the method comprising:
    depositing a first material over a semiconductor body having a surface in which at least one trench is formed, wherein a first layer is formed within the trench and on the surface of the semiconductor body outside the trench;
    depositing a second material, such that a second layer is formed above the first layer outside the trench and the trench is filled;
    chemical mechanical polishing to remove the second layer above the first layer outside the trench until portions of the first layer outside the trench are completely uncovered by said chemical mechanical polishing; and
    removing all of said first material of the first layer uncovered outside the trench by wet-chemical etching.

2. The method according to claim 1, wherein depositing the first material comprises depositing an electrically conductive material and wherein depositing the second material comprises depositing an electrically conductive material.

3. The method according to claim 1, depositing the first material comprises depositing tungsten.

4. The method according to claim 1, wherein the second material is deposited electrolytically.

5. The method according to claim 1, wherein the second material comprises copper.

6. The method according to claim 1, further comprising before depositing the first material, depositing a first interlayer that covers an inner wall of the trench and a surface of the semiconductor body outside the trench.

7. The method according to claim 6, wherein the first interlayer is formed from a titanium-containing material.

8. The method according to claim 6, further comprising, before depositing the second material, depositing a second interlayer onto the first layer.

9. The method according to claim 8, wherein the second interlayer is formed from a tantalum-containing material.

10. The method according to claim 1, wherein depositing the second material comprises forming a growth seed layer.

11. The method according to claim 9, wherein a physical vapor deposition is used for depositing the first and/or the second interlayer.

12. The method according to claim 8, wherein the chemical mechanical polishing comprises:

carrying out a first polishing step, in which the second material is polished selectively with respect to the second interlayer; and carrying out a second polishing step, in which the second interlayer is completely removed outside the trench such that the first layer is completely uncovered.

13. The method according to claim 6, wherein the wet-chemical etching comprises removing the residual first material of the first layer selectively with respect to the first interlayer.

14. The method according to claim 1, wherein the wet-chemical etching is carried out using a hydrogen peroxide solution.

15. The method according to claim 12, wherein, during the chemical mechanical polishing, the second material is subjected to chemical mechanical polishing with the aid of a polishing slurry containing iron nitrate; and wherein the second polishing step is carried out using a different polishing slurry from that in the first polishing step, wherein the polishing slurry of the second polishing step contains hydrogen peroxide.

16. The method according to claim 1, wherein the wet-chemical etching for removing the residual first material is effected as purely chemical etching without mechanical abrasion by polishing grains or polishing pads.

17. The method according to claim 6, wherein, after the wet-chemical etching, the first interlayer is removed from the surface of the semiconductor product by chemical mechanical polishing.

18. The method according to claim 1, wherein the trench is formed in a semiconductor body having a substrate and a dielectric layer arranged on or above the substrate the trench extending at least through a portion of the layer thickness of the dielectric layer.

19. The method according to claim 18, wherein the trench extends into the substrate.

20. A method for making a semiconductor device, the method comprising:

providing a semiconductor product having a substrate, wherein the semiconductor product has a surface in which at least one trench is arranged;

depositing a first interlayer onto the surface of the semiconductor product and into the trench;

depositing a first layer of a metallic first material onto the first interlayer by means of a chemical vapor deposition, said first layer deposited into the trench and outside of said trench;

depositing a second interlayer onto the first layer;

depositing a metallic second material, which predominantly contains copper, by means of an electrolytic deposition until the second material forms a second layer on the second interlayer outside the trench and the trench is completely filled with the second material;

chemical mechanical polishing until residual material of the first layer is uncovered outside the trench and the residual material of the first layer is retained on the first interlayer; and completely removing the residual material of the first layer outside the trench that was uncovered by the chemical mechanical polishing from the first interlayer by means of wet-chemical etching using hydrogen peroxide.

21. The method according to claim 20, wherein, during the wet-chemical etching of the residual material of the first layer, the second material filling the trench is externally oxidized to form an oxide, and the oxide is also removed during the removal of the first interlayer by means of a further polishing step.

22. A method for producing a conductive trench filling on a semiconductor product having at least one trench, the method comprising:

providing a semiconductor product that includes a substrate and a dielectric layer above the substrate, at least one trench that extending from a top side of the semiconductor product into the dielectric layer;

depositing at least one first layer of a first material, wherein the first layer extends over a surface of the semiconductor product and into the at least one trench;

depositing at least one second layer of an electrically conductive second material on or over the first layer until the second material covers the first layer over the whole area and fills the at least one trench;

chemical mechanical polishing the semiconductor product over and outside the at least one trench until the second material has been removed and the first material outside the at least one trench has been uncovered; and removing the uncovered first material outside the at least one trench by means of wet-chemical etching until the surface of the semiconductor product has been uncovered outside the at least one trench.

23. The method according to claim 22, wherein the trench is a trench for at least one interconnect and/or at least one contact hole filling.

24. A method for processing a semiconductor product, the method comprising:

providing a semiconductor product having at least one trench arranged in a surface of the semiconductor product;

depositing at least one first layer onto the surface of the semiconductor product and onto an inner wall of the trench;

depositing at least one second layer, which fills the trench and covers the first layer above the surface of the semiconductor product;

etching back the second layer outside the trench to the level of the first layer, whereby the first layer is at least uncovered outside the trench; and selectively wet-chemically etching the first layer until the surface of the semiconductor product is uncovered again outside the trench.

* * * * *